United States Patent
Yang

[11] Patent Number: 6,066,968
[45] Date of Patent: May 23, 2000

[54] DELAY LOCK LOOP CIRCUIT FOR SEMICONDUCTOR MEMORY DEVICE

[75] Inventor: Seung Yeub Yang, Kyoungki-do, Rep. of Korea

[73] Assignee: Hyundai Electronics Industries Co., Ltd., Ichon-shi, Rep. of Korea

[21] Appl. No.: 09/065,909

[22] Filed: Apr. 24, 1998

[30] Foreign Application Priority Data

Apr. 25, 1997 [KR] Rep. of Korea ........................ 97-15599

[51] Int. Cl.⁷ ...................................................... H03L 7/06
[52] U.S. Cl. .......................... 327/156; 327/117; 327/165; 327/172; 327/294
[58] Field of Search ..................................... 327/113, 114, 327/115, 117, 141, 144, 152, 153, 155, 156–158, 161, 165–166, 171, 172–173, 174, 176, 239, 261, 291, 293, 294–295, 298, 299

[56] References Cited

U.S. PATENT DOCUMENTS 4,754,163   6/1988   Aue et al. .

5,369,311   11/1994   Wang et al. .

*Primary Examiner*—Jeffrey Zweizig
*Attorney, Agent, or Firm*—Jacobson, Price, Holman & Stern, PLLC

[57] ABSTRACT

A delay lock loop circuit for a semiconductor memory element generates a synchronized internal clock signal by receiving an external clock signal as an input. The delay lock loop circuit generates a clock signal having a very fast period in order to enhance speed of data being synchronized by a clock signal. The delay lock loop (DLL) circuit includes: a N frequency dividing means which respectively receives the external signal having the frequency f, and generates a signal having a frequency f/N; a N delay lock loop means which respectively receives the signal having the frequency f/N generated from the N frequency dividing means, and maintains it for a predetermined period; and a merging means which performs a logic operation on each output pulse signal generated from the N delay lock loop means, and generates the synchronised internal signal.

3 Claims, 5 Drawing Sheets

DELAY LOCK LOOP CIRCUIT FOR SEMICONDUCTOR MEMORY DEVICE

BACKGROUND OF THE INVENTION

1. Field of the Invention

The present invention relates to a delay lock loop (hereinafter referred to as DLL) circuit for a semiconductor memory element which generates a synchronized internal clock signal by receiving an external clock signal as an input. More particularly, it relates to a DLL circuit for a semiconductor memory element which generates a clock signal having a very fast period in order to enhance speed of data being synchronized by a clock signal.

2. Description of the Prior Art

FIG. 1 is a block diagram of a conventional DLL circuit.

Referring to FIG. 1, the conventional DLL circuit includes: a receiver 1 for receiving an external clock signal as an input; a digital to time converter 2; a clock deliverer 3; a delay monitor portion 4; and an time to digital converter 5.

Operations of the conventional DLL circuit will now be described with reference to FIG. 2 showing a timing diagram of the conventional DLL circuit shown in FIG. 1.

First, if a cycle $t=\tau$, it is determined that $T1=t_{REC}$, $T2=t_{MON}$, $T3=t_{DELI}$, $T2=T1+T3$, and $T4=\tau-T2=\tau-t_{MON}$, where $\tau$ is an external clock period, $t_{REC}$ is a delay time of the receiver 1, and $t_{DELI}$ is a delay time of the clock deliverer 3. As shown in FIGS. 1 and 2, if a DLL locking signal is enabled at a 'HIGH' section of a start pulse signal START, a stop pulse signal STOP is disabled at the 'HIGH' section, and $\tau>T1+T2+T3$. That is, an external clock period $\tau$ should be longer than the total time including receiving time T1, transmitting time T2 and monitor delay time T3.

Where a semiconductor memory element requires a clock of a very fast period in order to enhance an operation speed, the conventional DLL circuit does not generate an appropriate pulse signal. Namely, if a pulse period of which $\tau$ is below 5 ns is determined to perform an I/O (input/output) operation over 200 MHz, it is difficult to determine operation timing such as shown in FIG. 2 with the conventional DLL circuit.

SUMMARY OF THE INVENTION

Accordingly, the present invention is directed to a DLL circuit for a semiconductor memory element that substantially obviates one or more of the problems which arise due to limitations and disadvantages of the related art.

It is an objective of the present invention to provide a DLL circuit for a semiconductor memory element which generates a clock signal having a very fast period in order to enhance speed of data being synchronized by a clock signal.

To achieve the above objective, in a delay lock loop (DLL) circuit for generating a synchronized internal signal after receiving an external signal having a frequency f, the delay lock loop (DLL) circuit includes:

N frequency dividing means which respectively receives the external signal having the frequency f, and generates a signal having a frequency f/N;

N delay lock loop (DLL) means which respectively receives the signal having the frequency f/N generated from the N frequency dividing means, and maintains it for a predetermined period; and a merging means which performs a logic operation on each output pulse signal generated from the N delay lock loop (DLL) means, and generates the synchronised internal signal.

The merging means can be embodied as a NAND logic operator or a NOR logic operator.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF THE PREFERRED EMBODIMENTS

Reference will now be made in detail to the preferred embodiments of the present invention, examples of which are illustrated in the accompanying drawings.

Figure 1:
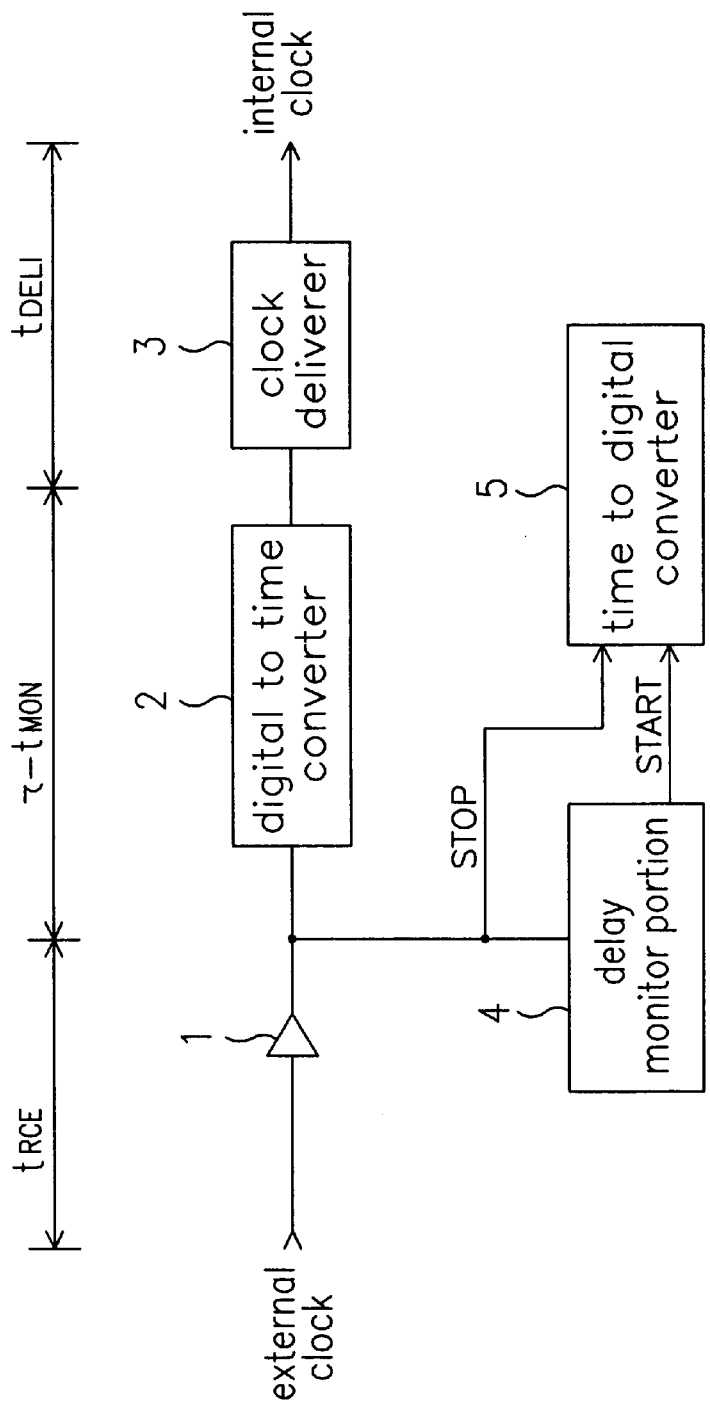
FIG. 1 is a block diagram of a conventional delay lock loop (DLL) circuit.
Figure 2:
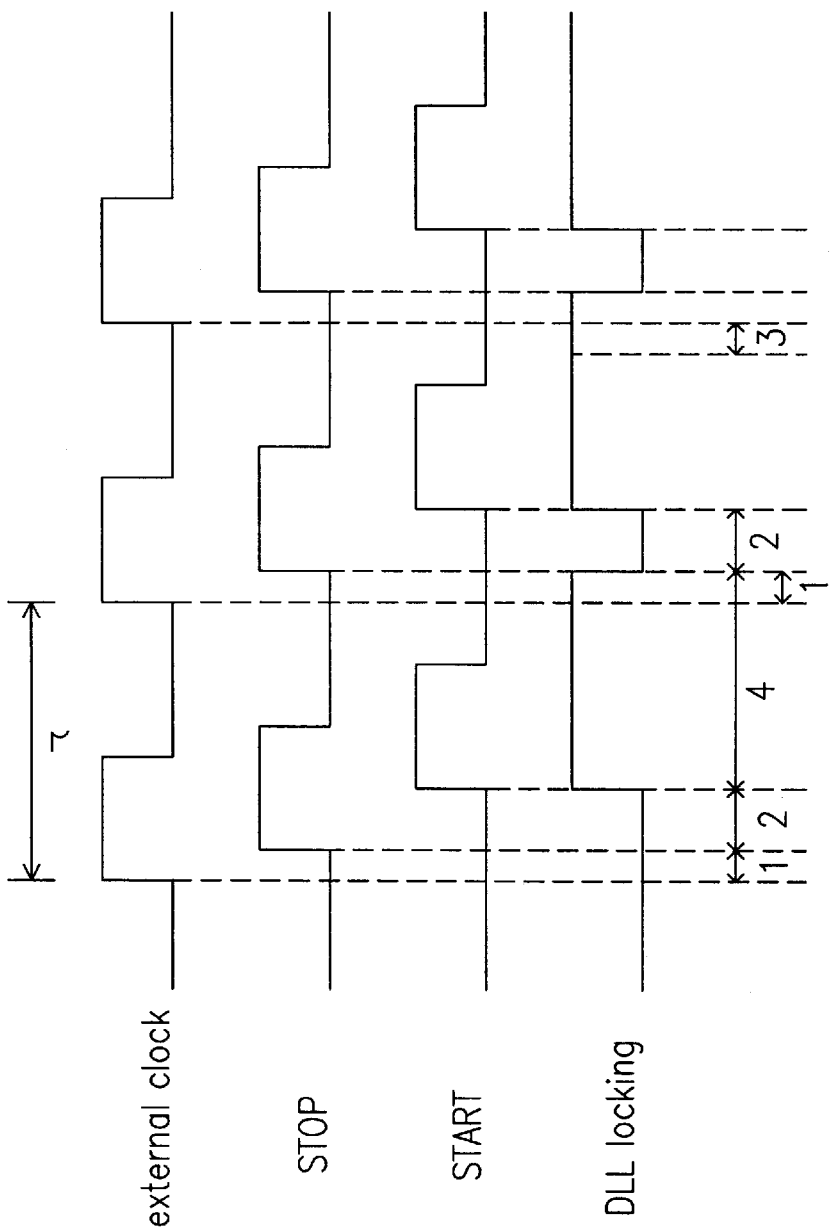
FIG. 2 is a timing diagram of the conventional DLL circuit shown in FIG. 1.
Figure 3:
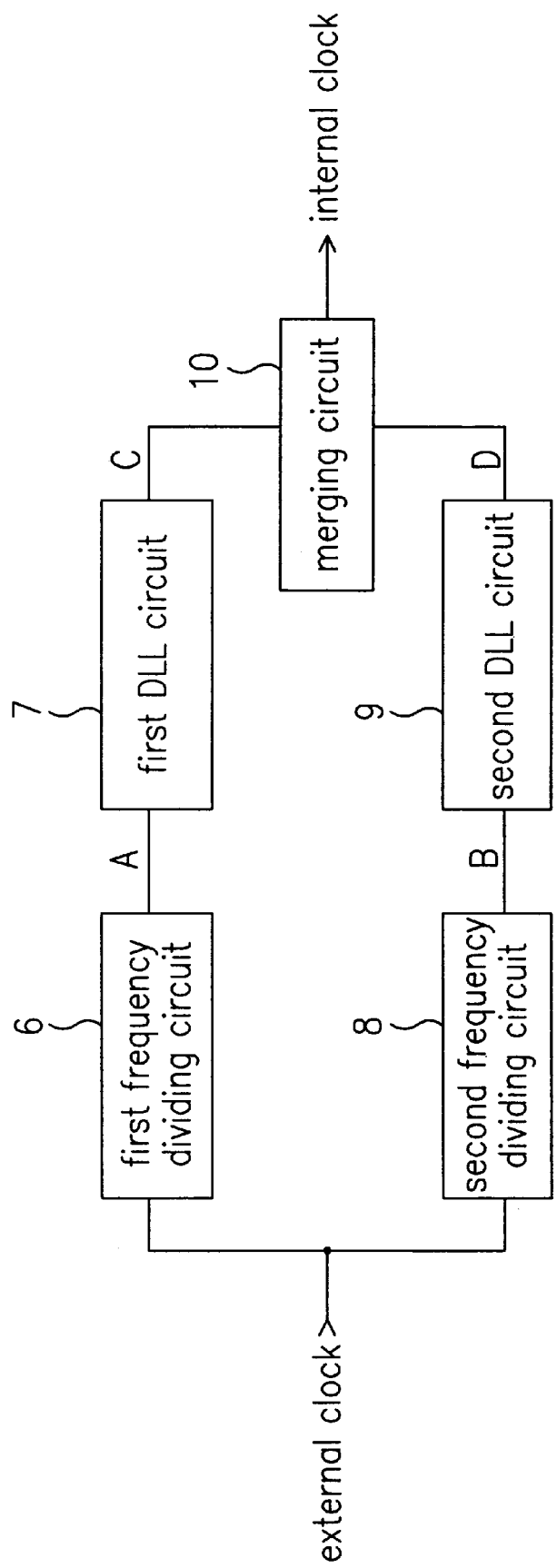
FIG. 3 is a block diagram of a DLL circuit in accordance with a first preferred embodiment of the present invention.

FIG. 3 is a block diagram of a DLL circuit in accordance with a first preferred embodiment of the present invention.

As shown in FIG. 3, the DLL circuit includes:

first and second frequency dividing circuits 6 and 8 which divide an external clock signal having a frequency f into a clock signal having a frequency f/2;

first and second DLL circuits 7 and 9 which receive an initial pulse signal of each internal clock generated from the first and second frequency dividing circuits 6 and 8, and maintain it for a predetermined period; and a merging circuit 10 which adds output pulse signals generated from the first and second DLL circuits 7 and 9. The merging circuit 10 can be embodied by a NAND logic operator or a NOR logic operator.

Figure 4:
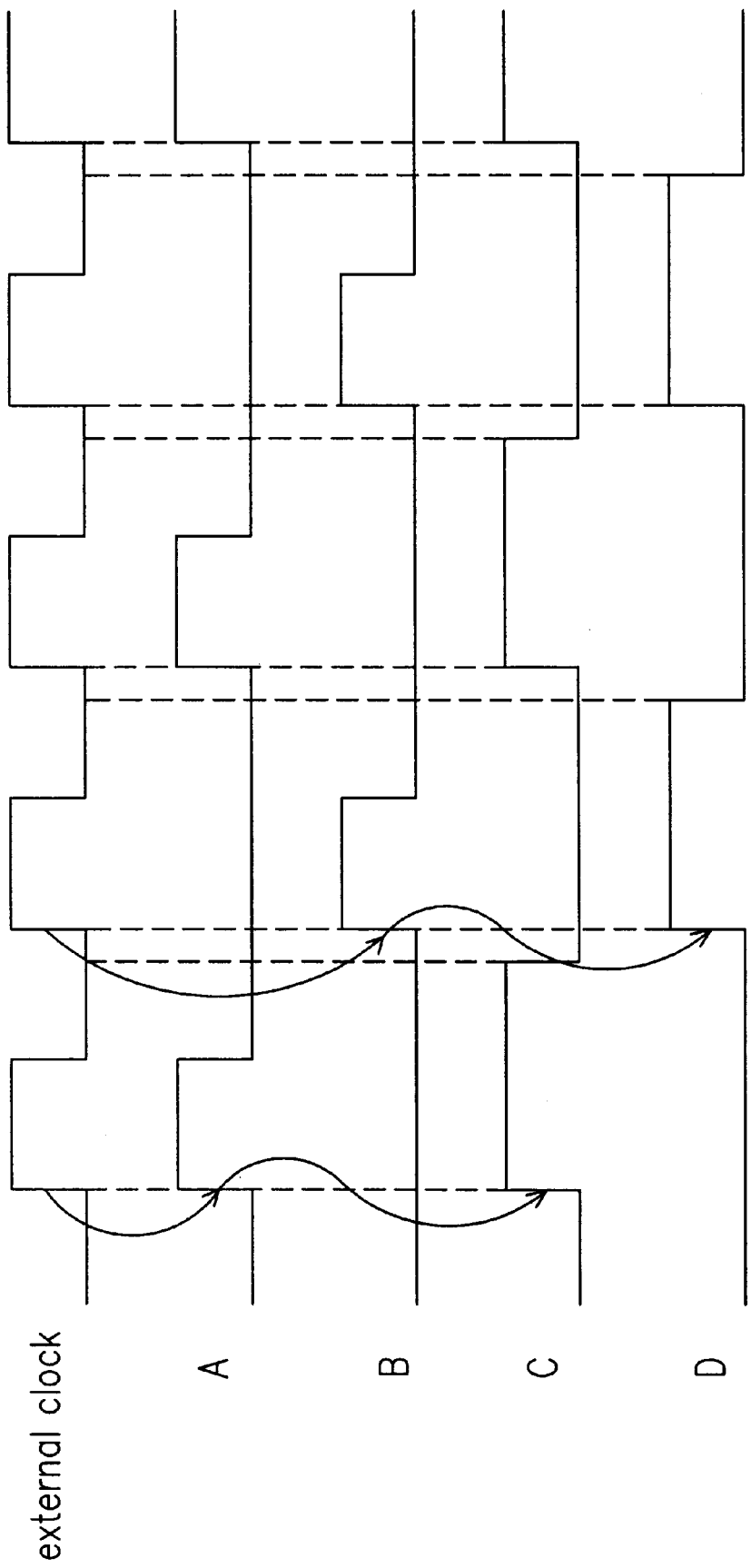
FIG. 4 is a timing diagram of the DLL circuit shown in FIG. 3.

The operation of FIG. 3 is shown in FIG. 4 illustrating a timing diagram of FIG. 3.

The output pulse signals of the frequency dividing circuits 6 and 8 have a reduced frequency. Pulse signals having reduced frequency are input to the first and second DLL circuits 7 and 9. If output pulse waveforms C and D from the first and second DLL circuits 7 and 9 are added therebetween by the merging circuit 10, I/O operation performance can be improved. Herein, the merging circuit adds the divided periods of the external clock signal.

Figure 5:
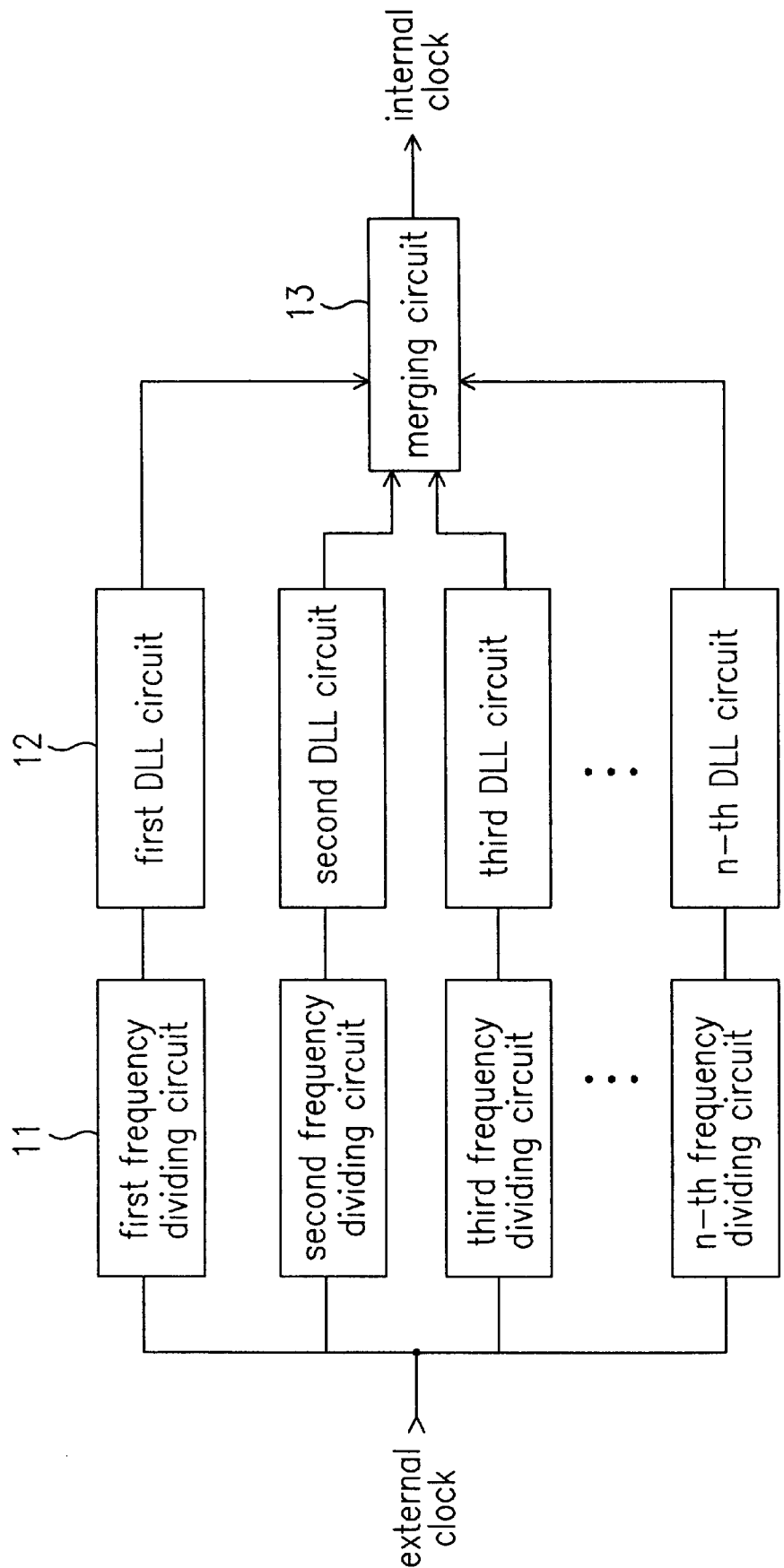
FIG. 5 is a block diagram of a DLL circuit in accordance with a second preferred embodiment of the present invention.

FIG. 5 is a block diagram of a DLL circuit in accordance with a second preferred embodiment of the present invention. While the aforementioned DLL circuit shown in FIG. 3 divides a period of the clock signal into two periods, the DLL circuit shown in FIG. 5 divides a period of the clock signal into N periods, thereby the DLL circuit shown in FIG. 5 generates a clock pulse signal having more fast period.

As described above, the DLL circuit according to the present invention has a double operation speed as compared with the conventional DLL circuit by dividing an external clock signal into two. Only the dividing circuit is needed to satisfy a desired clock frequency, without changing a DLL circuit.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A delay lock loop circuit for generating a synchronized internal signal after receiving an external signal of frequency f, the delay lock loop circuit comprising:

N frequency dividing means for receiving the external signal and for generating N respective divided-frequency signals of a frequency f/N;

N delay lock loop means for receiving the N respective divided-frequency signals, and for maintaining the N divided-frequency signals for a predetermined period as N output pulse signals, respectively; and merging means for performing a logic operation on the N outout pulse signals so as to generate the synchronized internal signal.

2. The delay lock loop circuit of claim 1, wherein:

the merging means is a NAND logic operator.

3. The delay lock loop circuit of claim 1, wherein:

the merging means is a NOR logic operator.

* * * * *